(12) United States Patent
Hamanaka et al.

(10) Patent No.: US 6,248,660 B1
(45) Date of Patent: Jun. 19, 2001

(54) METHOD FOR FORMING METALLIC PLUG

(75) Inventors: Masashi Hamanaka, Nara; Tetsuo Ishida, Osaka; Masafumi Shishino, Shiga, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/012,961

(22) Filed: Jan. 26, 1998

(30) Foreign Application Priority Data

Jan. 27, 1997 (JP) ................................... 9-012874

(51) Int. Cl.⁷ ................................ H01L 21/4763
(52) U.S. Cl. ....................... 438/629; 438/631; 438/633; 438/692
(58) Field of Search .................... 438/631, 633, 438/634, 648, 656, 685, 692, 691, 629

(56) References Cited

U.S. PATENT DOCUMENTS 5,262,354 * 11/1993 Cote et al. .
5,585,673 * 12/1996 Joshi et al. ............................ 257/751
5,854,140 * 12/1998 Jaso et al. ............................. 438/740
5,907,787 * 5/1999 Sato ...................................... 438/622

FOREIGN PATENT DOCUMENTS

8222630 * 8/1996 (JP) .

* cited by examiner

*Primary Examiner*—Caridad Everhart
(74) *Attorney, Agent, or Firm*—Merchant & Gould P.C.

(57) ABSTRACT

A method for forming a metallic plug capable of preventing the occurrence of defects due to a short between conductive layers and the decrease of reliability in a conductive layer caused by a change of plug resistance by polishing and eliminating a filling film and an adhesive layer using a slurry for polishing a metal after eliminating a part of the filling film by dry etching beforehand. A metal plug can be obtained by the following steps: forming an end connection opened in an interlayer dielectric so as to expose the surface of a conductive layer under the interlayer dielectric; forming an adhesive layer on the exposed conductive layer and on the interlayer dielectric; forming a filling film on the adhesive layer, which fills the end connection completely; eliminating 60% or more of the film thickness of the filling film formed by dry etching; and polishing and eliminating the filling film and the adhesive layer using a slurry for polishing a metal.

20 Claims, 8 Drawing Sheets

METHOD FOR FORMING METALLIC PLUG

FIELD OF THE INVENTION

This invention relates to a method for forming a metallic plug, for example, in a manufacturing process in a silicon semiconductor device.

BACKGROUND OF THE INVENTION

In order to realize high performance in a silicon semiconductor device, it is necessary to make a device minute and multilayer in structure. However, it has become more difficult to improve reliability in metal wiring, as the device has become smaller. In order to improve reliability in metal wiring, it is particularly necessary to make an extremely large recessed volume of metal small enough in the case of forming a metallic plug that is used for improving reliability at an end connection portion for connecting wires of an upper layer and of a lower layer. Recently, a polishing technique has been introduced into a silicon semiconductor process as a means for reducing a recessed volume.

An example of a conventional method for forming a metallic plug using the polishing technology is explained referring to FIGS. 8A–8D as follows. First, an aluminum alloy film is formed on an interlayer dielectric 1, which insulates an upper wire and a lower wire, by a sputter deposition method or the like. After forming a predetermined resist pattern on the aluminum alloy film by a photolithographic process, the extra aluminum alloy film is eliminated by dry etching and the resist is then also eliminated, thus obtaining a conductive layer 3 as shown in FIG. 8A. In this case, an example of metal wiring using an aluminum alloy film as the conductive layer 3 is explained, but the conductive layer 3 may be a conductive layer or diffusion layer such as a polycrystalline silicon or the like.

Next, a dielectric that is a silicone oxide film is formed by a CVD method and the dielectric is planarized through a planarization process, thus forming an interlayer dielectric 2. After forming a predetermined resist pattern on the interlayer dielectric 2 by a photolithographic process, an extra dielectric is eliminated by dry etching and the resist is then also eliminated, thus obtaining an end connection 4. The end connection 4 is used for connecting the conductive layer 3 and another conductive layer formed thereon, and is open so that the surface of the conductive layer 3 is exposed.

As a next step, an adhesive layer 5 having a layered structure of a titanium nitride film and a titanium film is formed by a sputter deposition method or the like as shown in FIG. 8B. A tungsten film 6 as a filling film is then formed using a CVD method so as to fill in the end connection 4 completely as shown in FIG. 8C. The film thickness of the tungsten film 6 is about 0.3 $\mu$m–1.0 $\mu$m except for the end connection 4 portions.

Finally, a metallic plug 7 is obtained by polishing the tungsten film 6 and the adhesive layer 5 using a polishing device until a part of the interlayer dielectric 2 where the end connection 4 is not formed is completely exposed as shown in FIG. 8D. In a slurry used in the polish, alumina is used as an abrasive grain, and iron nitrate, a hydrogen peroxide solution, potassium iodate or the like is used for adjusting pH.

There is no big difference of elevation between the surface of the interlayer dielectric 2 exposed and that of the metallic plug 7, since tungsten is eliminated by polishing. As a result, the recessed volume at the end connection 4 portions after eliminating the tungsten film 6 can be 0.1 $\mu$m or less, thus obtaining a highly reliable conductive layer.

However, in the conventional method mentioned above for forming a metallic plug, when the variation in a polishing rate within a substrate in the case of polishing the tungsten film 6 is not small enough with respect to the variation within a substrate in the case of forming a tungsten film, the polishing time until the interlayer dielectric 2 is exposed is different at different places within the substrate. When the polishing time is different, a portion 8 of the adhesive layer 5 that can not be eliminated is created within the substrate as shown in FIG. 8D. As mentioned above, in the case where the adhesive layer can not be eliminated, reliability in a semiconductor device decreases, since a short occurs between conductive layers in the same layer.

Furthermore, even in the case where polishing is conducted only for eliminating the whole tungsten film 6 and adhesive layer 5 within the substrate, a difference of elevation (erosion) 9 depending on a pattern density of the end connection 4 occurs on the surface of the interlayer dielectric 2, since an area having a rapid polishing rate is overpolished. As mentioned above, pattern formation in a photolithography process becomes difficult, when difference of elevation occurs on an interlayer dielectric. Moreover, height of a metallic plug is different according to the difference of elevation of an interlayer dielectric, which causes great variations in resistance at an end connection. As a result, reliability decreases.

SUMMARY OF THE INVENTION

The problem mentioned above can be solved by a method for forming a metallic plug of the present invention. It is an object of the present invention to prevent pattern defects by erosion or a short between conductive layers caused by variation in a polishing rate within a substrate and decrease of reliability in a conductive layer by eliminating a filling film by dry etching beforehand before polishing the filling film such as a tungsten film or the like.

In order to achieve the object mentioned above, a first method for forming a metallic plug of the present invention comprises the following steps: forming an end connection opened in an interlayer dielectric so as to expose the surface of a conductive layer under the interlayer dielectric; forming an adhesive layer on the conductive layer exposed and on the interlayer dielectric; and forming a filling film on the adhesive layer, which fills the end connection completely. The first method for forming a metallic plug of the present invention is characterized by polishing and eliminating the filling film and the adhesive layer using a slurry for polishing a metal after eliminating the filling film by dry etching beforehand.

According to the first method for forming a metallic plug, even in the case of having great variations in a polishing rate within a substrate in the case of polishing the filling film, the variation in the remaining film within the substrate in the case of eliminating the filling film and the adhesive layer completely can be minimized and the volume to be overpolished can be restrained to a low level due to a small volume of the filing film to be polished. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented.

In the first method for forming a metallic plug, it is preferable that the adhesive layer has a layered structure of a titanium nitride film and a titanium film. In the case where the adhesive layer has a layered structure as mentioned above, a filling film can adhere to a conductive layer tightly enough.

In addition, it is preferable that the filling film is a tungsten film. In the case of using the tungsten film, the tungsten film can be eliminated by polishing.

Furthermore, it is also preferable that the film thickness of the filling film before being dry etched is in the range of 0.3–1.0 μm at a portion not having an end connection. In the case where the film thickness is in the range mentioned above, the end connection can be completely filled.

It is further preferable that a volume of the filling film to be eliminated beforehand is 60% or more of the film thickness of the filling film formed. According to such a method for forming a metallic plug, even in the case of having great variations in a polishing rate within a substrate in the case of polishing a filling film, the variation in the remaining film within the substrate in the case of eliminating the filling film and the adhesive layer completely can be minimized and the volume to be overpolished can be restrained to a low level, since the volume of the filling film to be polished can be reduced definitely and sufficiently.

Next, a second method for forming a metallic plug of the present invention comprises the following steps: forming an end connection opened in an interlayer dielectric so as to expose the surface of a conductive layer under the interlayer dielectric; forming an adhesive layer on the conductive layer exposed and on the interlayer dielectric; and forming a filling film on the adhesive layer, which fills the end connection completely. The second method for forming a metallic plug of the present invention is characterized by eliminating the filling film by dry etching beforehand until a part of the adhesive layer where the end connection is not formed is exposed and then polishing and eliminating the adhesive layer exposed using a slurry.

According to the second method for forming a metallic plug, even in the case of having great variations in a polishing rate within a substrate in the case of polishing a filling film, the volume to be polished and the volume to be overpolished caused by eliminating the adhesive layer completely can be restrained to a low level, since only the adhesive layer needs to be polished. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented.

In the second method for forming a metallic plug, it is preferable that the adhesive layer has a layered structure of a titanium nitride film and a titanium film. In the case where the adhesive layer has a layered structure as mentioned above, a filling film can adhere to a conductive layer tightly enough.

In addition, it is preferable that the filling film is a tungsten film. In the case where the tungsten film is used, the tungsten film can be eliminated by polishing.

Furthermore, it is also preferable that the film thickness of the filling film before being dry etched is in the range of 0.3–1.0 μm at a portion not having an end connection. In the case where the film thickness is in the range mentioned above, the end connection can be completely filled.

It is preferable that the polishing rates of the slurry for the adhesive layer and the interlayer dielectric are almost same. In the case of using such a slurry, erosion by overpolish can be reduced.

It is further preferable that the polishing rate of the slurry for the filling film is lower than that for the adhesive layer and the interlayer dielectric. In the case of using such a slurry mentioned above, a decrease of reliability in a conductive layer can be prevented, since the surface of a metallic plug does not become lower than that of an interlayer dielectric.

Moreover, it is preferable that the slurry is a slurry for polishing an oxide film comprising at least one particle selected from a silicon oxide particle and a ceric oxide particle In the case of using such a slurry mentioned above, for example, if an adhesive layer has a layered structure of a titanium nitride film and a titanium film and a silicon oxide film is used as an interlayer dielectric, erosion by overpolishing can be reduced, since there is no big difference between the polishing rate of an adhesive layer and that of a layer insulation film. Furthermore, in the case of using a tungsten film as a filling film, a decrease of reliability in a conductive layer can be prevented, since the surface of a metallic plug does not become lower than that of an interlayer dielectric due to low polishing rate of the tungsten film.

It is also preferable that polishing rates of the slurry for the adhesive layer, the interlayer dielectric and the filling film are almost same. In the case of using such a slurry, erosion by overpolishing can be reduced and the surface of a metallic plug and that of the interlayer dielectric can form an even surface, thus preventing decrease of reliability in a conductive layer.

It is further preferable that the slurry is a slurry comprising mixed particles including two or more types of particles. In the case of using such a slurry mentioned above, the polishing rates of the adhesive layer, the interlayer dielectric and the filling film can be almost same. As a result, erosion by overpolishing can be reduced and the surface of a metallic plug and that of the interlayer dielectric can form an even surface, thus preventing the decrease of reliability in a conductive layer.

It is preferable that the slurry is a slurry comprising mixed particles of a silicon oxide particle and an alumina particle.

Furthermore, it is also preferable that the slurry is a slurry comprising mixed particles of a ceric oxide particle and an alumina particle.

In the case of using such a slurry mentioned above, for example, if an adhesive layer has a layered structure of a titanium nitride film and a titanium film and a silicon oxide film is used as an interlayer dielectric, erosion by overpolishing can be reduced, since there is no big difference between the polishing rate of an adhesive layer and that of a layer insulation film. Furthermore, in the case of using a tungsten film as a filling film, the polishing rate of the tungsten film is almost same as that of the adhesive layer and the interlayer dielectric. As a result, the surface of a metallic plug and that of the interlayer dielectric can form an even surface, thus preventing the decrease of reliability in a conductive layer.

Next, a third method for forming a metallic plug of the present invention comprises the following steps: forming an end connection opened in an interlayer dielectric so as to expose the surface of a conductive layer under the interlayer dielectric; forming an adhesive layer on the conductive layer exposed and on the interlayer dielectric; and forming a filling film on the adhesive layer, which fills the end connection completely. The third method for forming a metallic plug of the present invention is characterized by eliminating the filling film and the adhesive layer by dry etching beforehand until the part of the interlayer dielectric where the end connection is not formed is exposed and then polishing and eliminating the residue of the adhesive layer using a slurry for polishing a metal.

According to the third method for forming a metallic plug, even in the case of having great variations in a polishing rate within a substrate in the case of polishing, the volume to be polished and also the volume to be overpolished can be restrained to a low level, since only the residue of the adhesive layer needs to be eliminated. As a result, the occurrence of defects due to a short between conductive layers caused by creating a portion where an adhesive layer can not be eliminated can be prevented. In addition, decrease of reliability in a conductive layer caused by change of a plug resistance due to erosion can be prevented.

In the third method for forming a metallic plug, it is preferable that the adhesive layer has a layered structure of a titanium nitride film and a titanium film. In the case where the adhesive layer has a layered structure as mentioned above, a filling film can adhere to a conductive layer tightly enough.

In addition, it is preferable that the filling film is a tungsten film. In the case where the tungsten film is used, the tungsten film can be eliminated by polishing.

Furthermore, it is also preferable that the film thickness of the filling film before being dry etched is in the range of 0.3–1.0 $\mu$m at a portion not having an end connection. In the case where the film thickness is in the range mentioned above, the end connection can be completely filled.

DETAILED DESCRIPTION OF THE INVENTION (Embodiment 1)

Embodiment 1 of a method for forming a metallic plug of the present invention will be explained referring to the figures as follows. FIGS. 1A–1E includes cross-sectional views of a semiconductor device in a manufacturing process of a metallic plug according to Embodiment 1 of the present invention. In FIGS. 1A–1E, each of A, B and C indicates a process for forming a tungsten film 6, which is identified with the same number as in FIGS. 8A–8D, and the explanation is omitted, since these processes are identical to those of the conventional example explained using FIGS. 8A–8D.

Figure 1A:
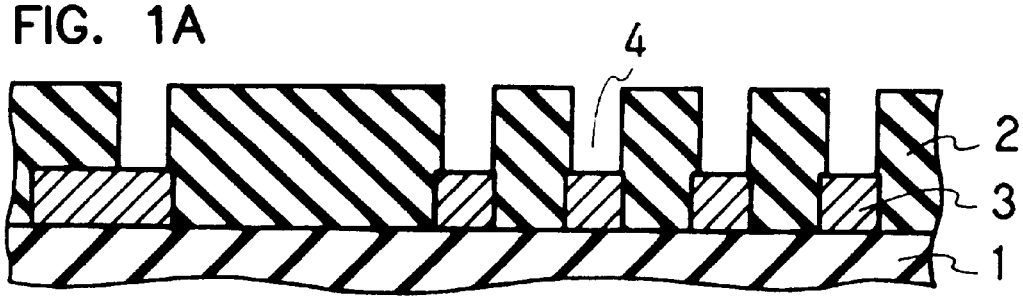
FIGS. 1A–1E show cross-sectional views of a semiconductor device being processed according to an Embodiment 1 of a method for forming a metallic plug of the present invention.
Figure 1B:
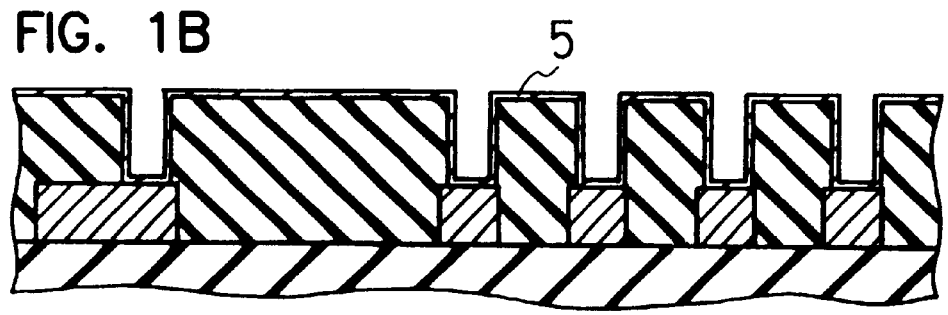
Figure 1C:
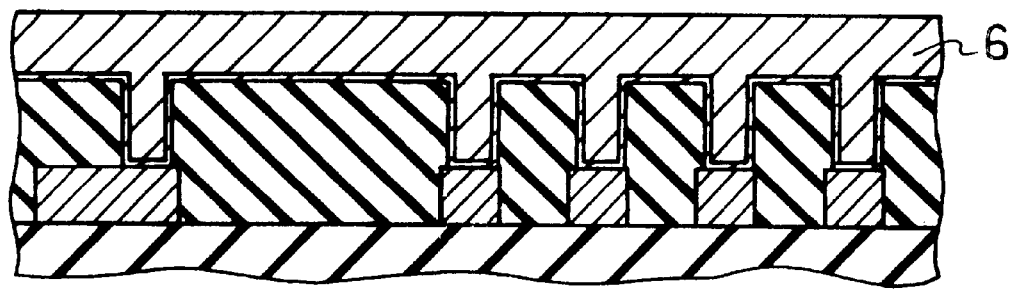
Figure 1D:
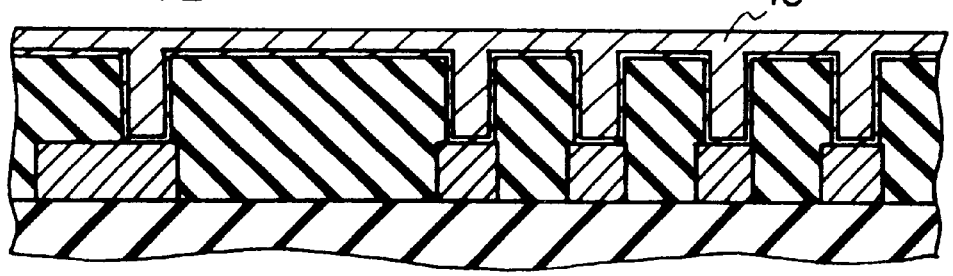

A process after forming a tungsten film 6 will be explained as follows. After forming a tungsten film 6, the tungsten film 6 is eliminated by dry etching as shown in FIG. 1D. A numeral 10 is the tungsten film after being eliminated by dry etching. Dry etching having a uniform etching rate within a substrate and a high etching rate is generally employed. The volume eliminated by etching is 60% or more of the film thickness of the tungsten film formed. In this case, the film thickness to be a reference of the volume to be eliminated is the film thickness between the surface of a part of an adhesive layer 5 where an end connection 4 is not formed and the surface of the tungsten film 6. That is to say, the film thickness of the tungsten film 6 at the end connection 4 portion is not included. In this Embodiment, the film thickness of the tungsten film is in the range of 0.3–1.0 $\mu$m (same as in Embodiments 2–5 below).

Figure 1E:
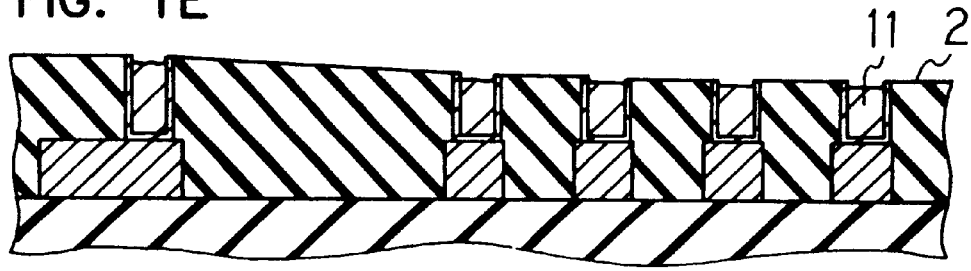

Finally, a metallic plug 11 is obtained by polishing the tungsten film 10 and the adhesive layer 5 using a slurry for polishing a metal until a part of the interlayer dielectric 2 where the end connection 4 is not formed is completely exposed as shown in FIG. 1E.

When a metallic plug is formed according to such a method mentioned above, even in the case of having great variations in a polishing rate within a substrate in the case of polishing a tungsten film, the variation in the remaining film within the substrate in the case of eliminating the tungsten film and the adhesive layer completely can be minimized and the volume to be overpolished can be restrained to a low level due to the small volume of the tungsten film to be polished. As a result, the occurrence of defects due to a short between conductive layers caused by creating a portion where an adhesive layer can not be eliminated can be prevented. In addition, the decrease of reliability in a conductive layer caused by the change of plug resistance due to erosion can be prevented.

(Embodiment 2)

Figure 2A:
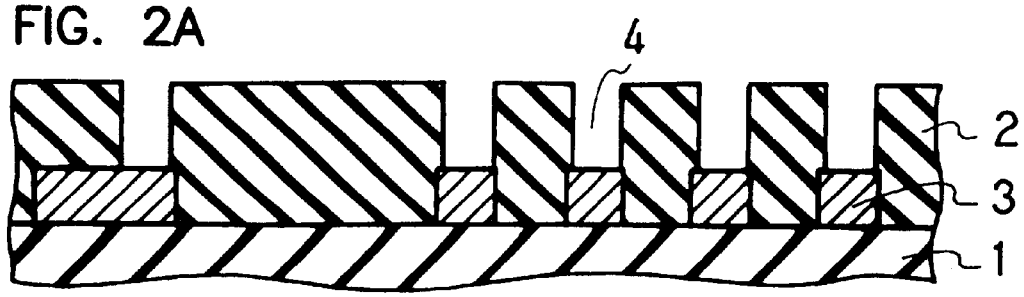
FIGS. 2A–2E show cross-sectional views of a semiconductor device being processed according to an Embodiment 2 of a method for forming a metallic plug of the present invention.
Figure 2B:
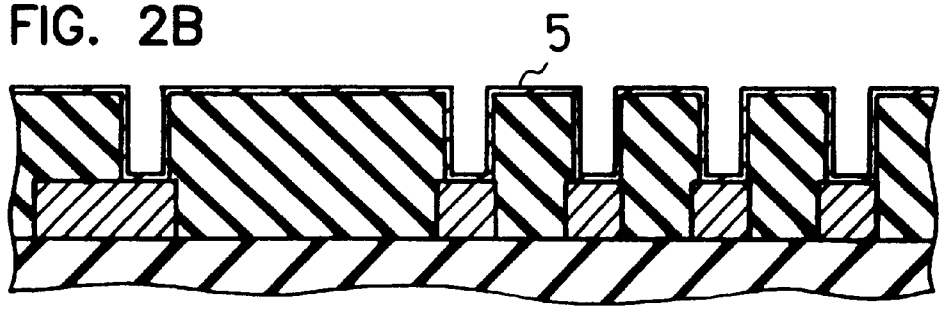
Figure 2C:
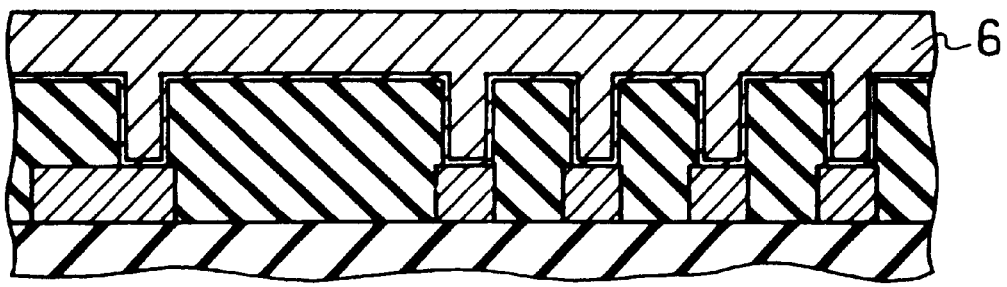

Embodiment 2 of a method for forming a metallic plug of the present invention will be explained referring to the figures as follows. FIGS. 2A–2E includes cross-sectional views of a semiconductor device in a manufacturing process of a metallic plug according to Embodiment 2 of the present invention. In FIGS. 2A, 2B, and 2C indicates a process for forming a tungsten film 6, which is identified with the same number as in FIGS. 8A–8D, and the explanation is omitted, since these processes are identical to those of the conventional example explained using FIGS. 8A–8D.

Figure 2D:
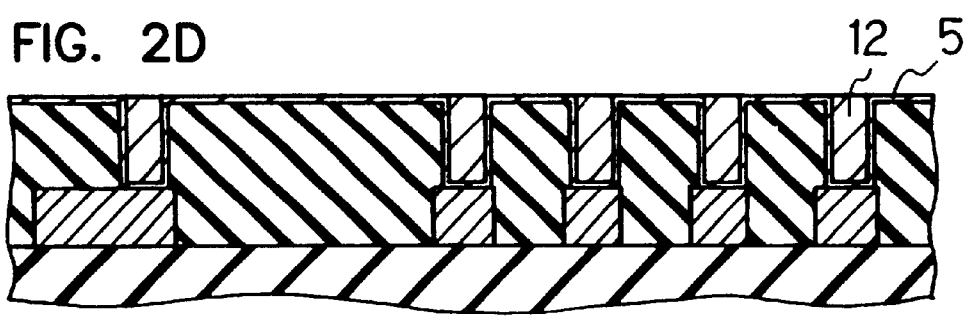

A process after forming a tungsten film 6 will be explained as follows. After forming a tungsten film 6, the tungsten film 6 is eliminated by dry etching until a part of the adhesive layer 5 where the end connection 4 is not formed is exposed as shown in FIG. 2D, thus obtaining a tungsten film 12. Dry etching having a uniform etching rate within a substrate and a high etching rate is generally employed.

Figure 2E:
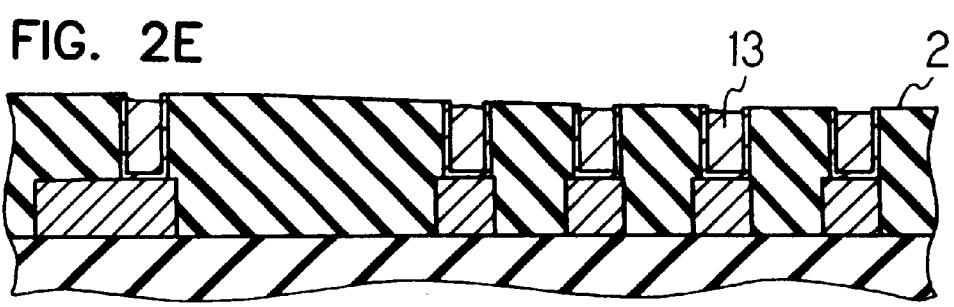

Finally, a metallic plug 13 is obtained by polishing the adhesive layer 5 using a slurry for polishing a metal until a part of the interlayer dielectric 2 where the end connection 4 is not formed is completely exposed as shown in FIG. 2E.

When a metallic plug is formed according to such a method mentioned above, even in the case of having great variations in a polishing rate within a substrate in the case of polishing a tungsten film, the volume to be polished and the volume to be overpolished caused by eliminating an adhesive layer completely can be restrained to a low level, since only the adhesive layer needs to be polished. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented.

(Embodiment 3)

Figure 3A:
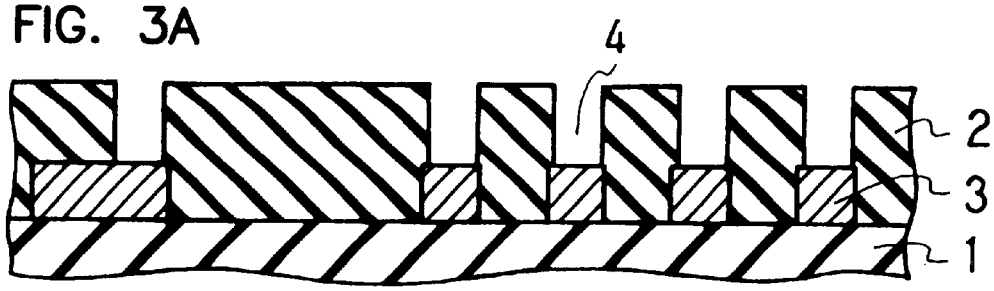
FIGS. 3A–3E show cross-sectional views of a semiconductor device being processed according to an Embodiment 3 of a method for forming a metallic plug of the present invention.
Figure 3B:
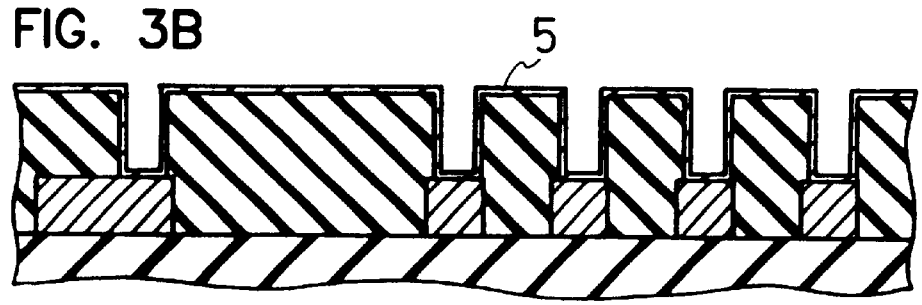
Figure 3C:
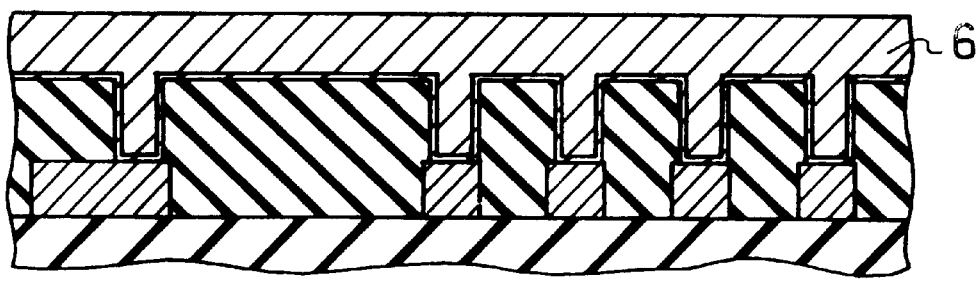

Embodiment 3 of a method for forming a metallic plug of the present invention will be explained referring to the figures as follows. FIGS. 3A–3E includes cross-sectional views of a semiconductor device in a manufacturing process of a metallic plug according to Embodiment 3 of the present invention. In FIGS. 3A, 3B, and 3C indicates a process for forming a tungsten film 6, which is identified with the same number as in FIGS. 8A–8D, and the explanation is omitted, since these processes are identical to those of the conventional example explained using FIGS. 8A–8D.

Figure 3D:
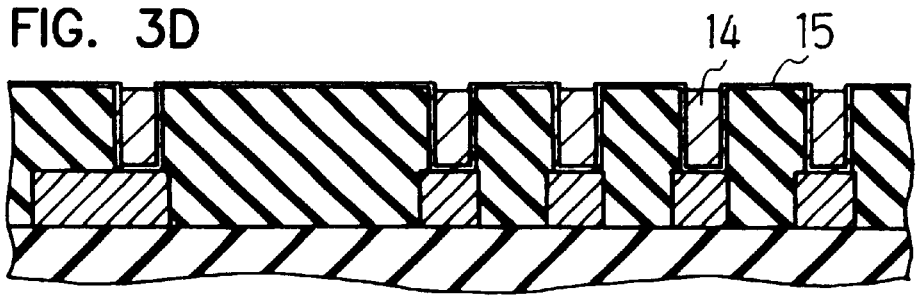

A process after forming a tungsten film 6 will be explained as follows. After forming a tungsten film 6, the tungsten film 6 and an adhesive layer 5 are eliminated by dry etching as shown in FIG. 3D. A numeral 14 is the tungsten film after being eliminated by dry etching. Dry etching having a uniform etching rate within a substrate and a high etching rate is generally employed. A volume to be eliminated by etching is defined as etching until a part of the interlayer dielectric 2 where the end connection 4 is not formed is exposed. A numeral 15 indicates a residue of the adhesive layer etched until the interlayer dielectric 2 is exposed. That is to say, the adhesive layer 5 remains as the residue 15 in a portion where the interlayer dielectric 2 is not completely exposed.

Figure 3E:
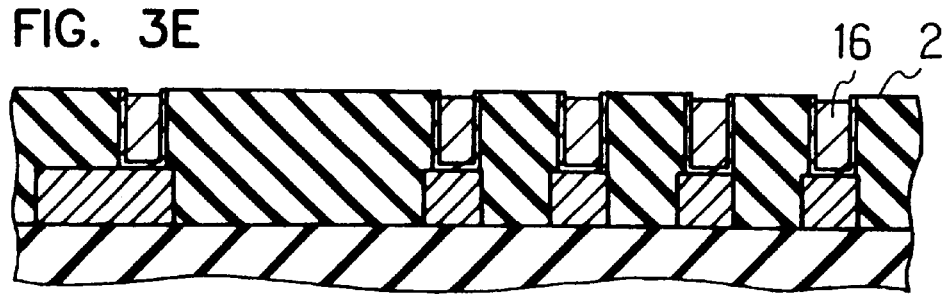

Finally, a metallic plug 16 is obtained by polishing the residue 15 of the adhesive layer 5 using a slurry for polishing a metal until the residue 15 of the adhesive layer 5 is completely eliminated as shown in FIG. 3E.

When a metallic plug is formed according to such a method mentioned above, even in the case of having great variations in a polishing rate within a substrate in the case of polishing, the volume to be polished and the volume to be overpolished can be restrained to a low level, since only the residue of an adhesive layer needs to be eliminated. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented.

(Embodiment 4)

Figure 4A:
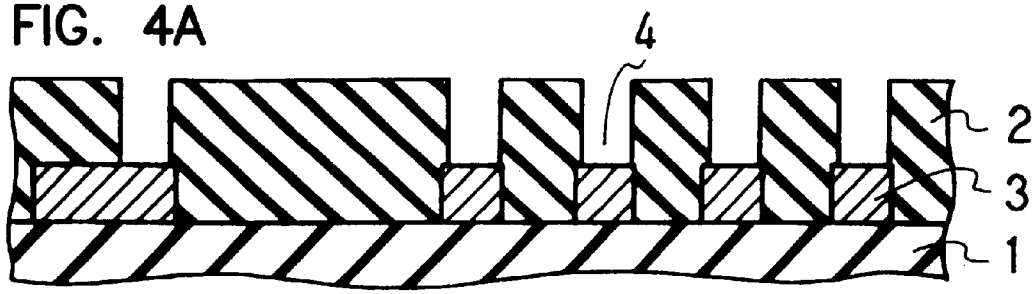
FIGS. 4A–4E show cross-sectional views of a semiconductor device being processed according to an Embodiment 4 of a method for forming a metallic plug of the present invention.
Figure 4B:
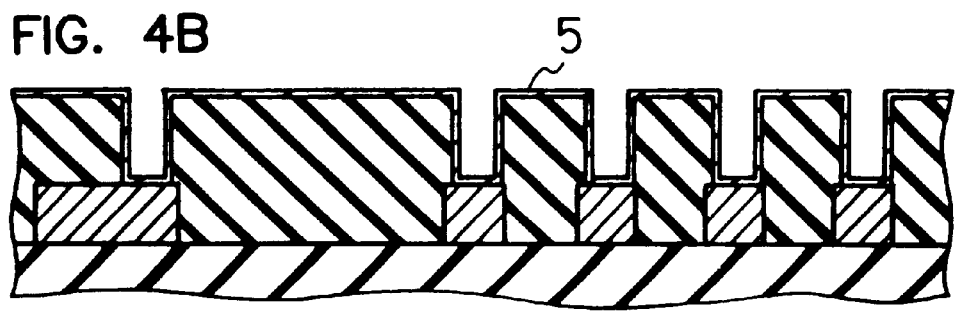
Figure 4C:
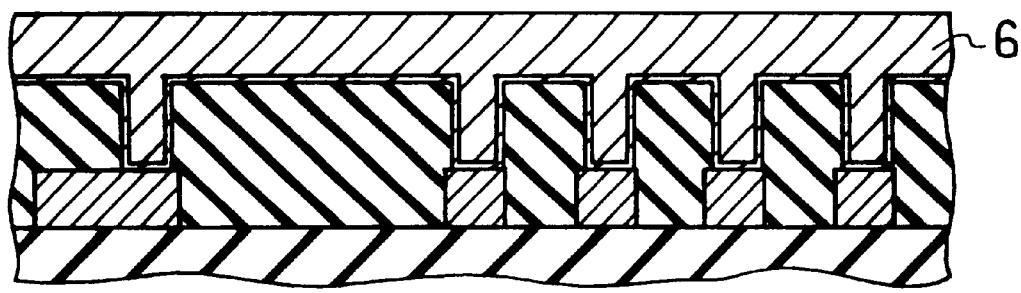

Embodiment 4 of a method for forming a metallic plug of the present invention will be explained referring to the figures as follows. FIGS. 4A–4E includes cross-sectional views of a semiconductor device in a manufacturing process of a metallic plug according to Embodiment 4 of the present invention. In FIGS. 4A, 4B, and 4C indicates a process for forming a tungsten film 6, which is identified with the same number as in FIGS. 8A–8D , and the explanation is omitted, since these processes are identical to those of the conventional example explained using FIGS. 8A–8D.

Figure 4D:
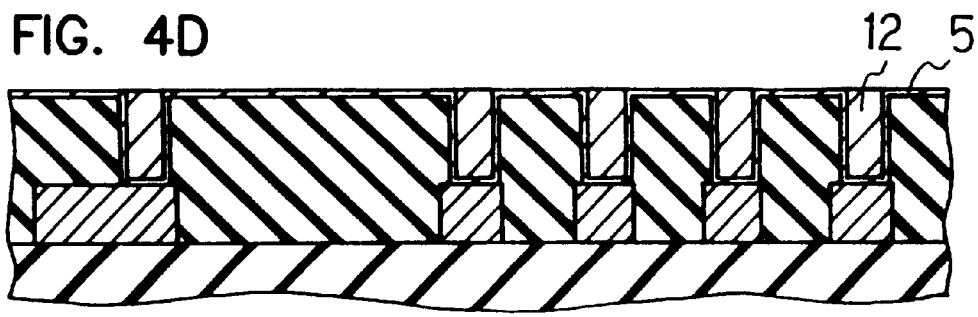

A process after forming a tungsten film 6 will be explained as follows. After forming a tungsten film 6, the tungsten film 6 is eliminated by dry etching until a part of an adhesive layer 5 where the end connection 4 is not formed is exposed as shown in FIG. 4D, thus obtaining a tungsten film 12. Dry etching having a uniform etching rate within a substrate and a high etching rate is generally employed.

Figure 4E:
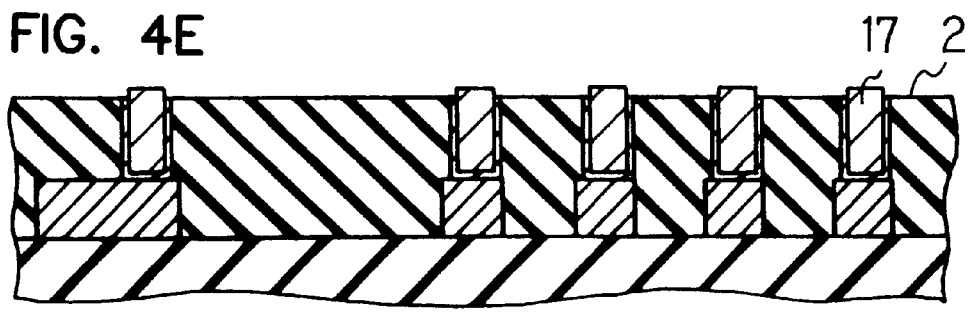

Finally, a metallic plug 17 is obtained by polishing the adhesive layer 5 using a slurry for polishing an oxide film comprising a silicon oxide particle or a ceric oxide particle until a part of the interlayer dielectric 2 where the end connection 4 is not formed is completely exposed as shown in FIG. 4E.

Figure 5:
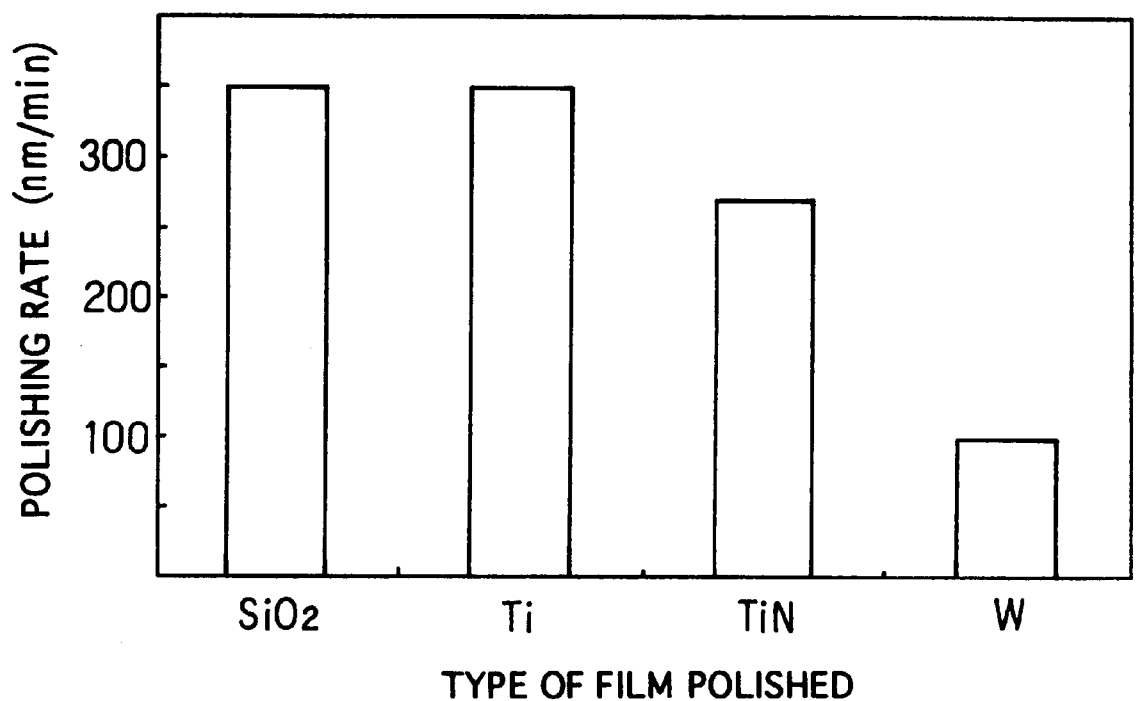
FIG. 5 is a graph illustrating an example of the relationship between the type of film polished and the polishing rate according to Embodiment 4 of the present invention.

When a metallic plug is formed according to such a method mentioned above, erosion by overpolishing can be reduced, since there is no big difference between the polishing rate of the adhesive layer 5 having a layered structure of a titanium nitride film and a titanium film and that of the interlayer dielectric 2 that is a silicon oxide film as in an example shown in FIG. 5. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented. Furthermore, the surface of a metallic plug does not become lower than the surface of an interlayer dielectric, since the polishing rate of the tungsten film is small, thus improving reliability in a conductive layer.

(Embodiment 5)

Figure 6A:
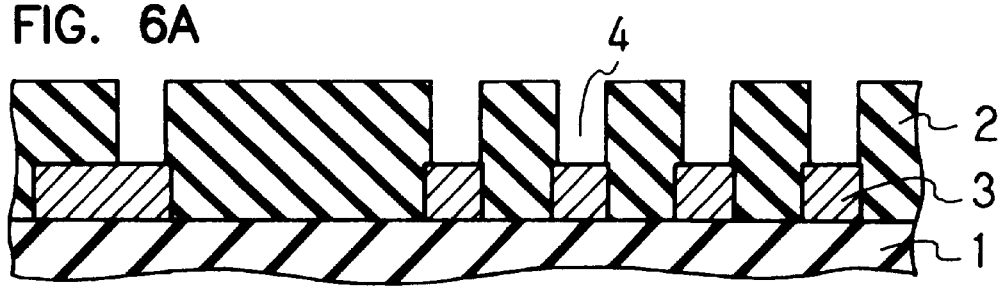
FIGS. 6A–6E show cross-sectional views of a semiconductor device being processed according to an Embodiment 5 of a method for forming a metallic plug of the present invention.
Figure 6B:
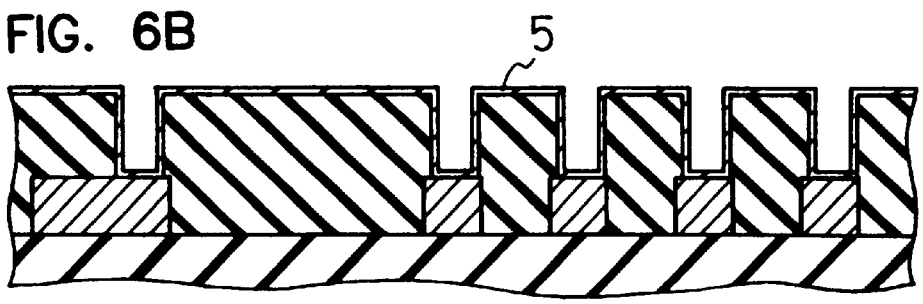
Figure 6C:
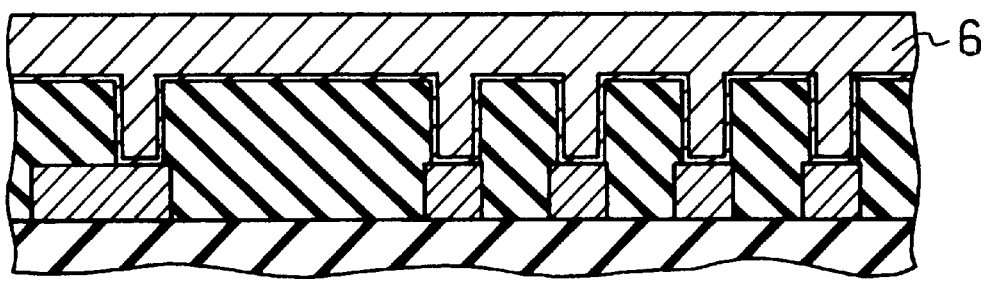

Embodiment 5 of a method for forming a metallic plug of the present invention will be explained referring to the figures as follows. FIGS. 6A–6E includes cross-sectional views of a semiconductor device in a manufacturing process of a metallic plug according to Embodiment 5 of the present invention. In FIGS. 6A, 6B, and 6C indicates a process for forming a tungsten film 6, which is identified with the same number as in FIG. 8, and the explanation is omitted, since these processes are identical to those of the conventional example explained using FIGS. 8A–8D.

Figure 6D:
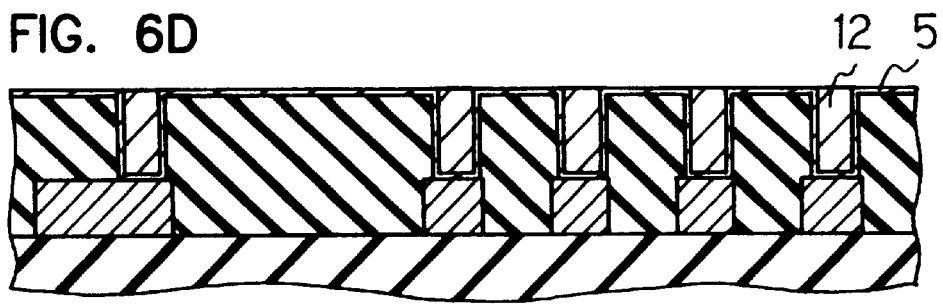

A process after forming a tungsten film 6 will be explained as follows. After forming a tungsten film 6, the tungsten film 6 is eliminated by dry etching until a part of the adhesive layer 5 where the end connection 4 is not formed is exposed as shown in FIG. 6D, thus obtaining a tungsten film 12. Dry etching having a uniform etching rate within a substrate and a high etching rate is generally employed.

Figure 6E:
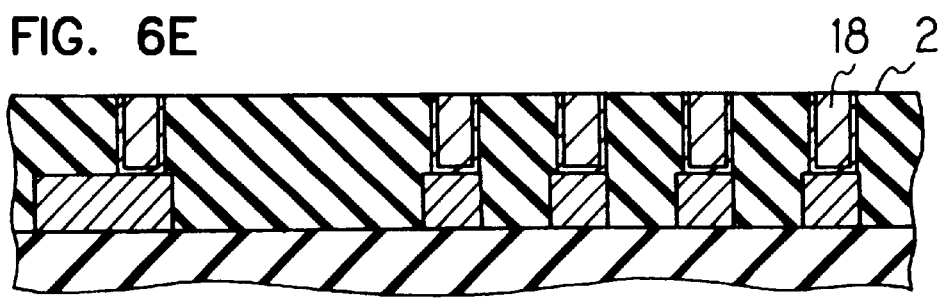

Finally, a metallic plug 18 is obtained by polishing the adhesive layer 5 using a slurry comprising mixed particles until a part of the interlayer dielectric 2 where the end connection 4 is not formed is completely exposed as shown in FIG. 6E. The mixed particles included in the slurry are preferably mixed particles including two or more particles such as mixed particles of a silicon oxide particle and an alumina particle, of a ceric oxide particle and an alumina particle or the like.

Figure 7:
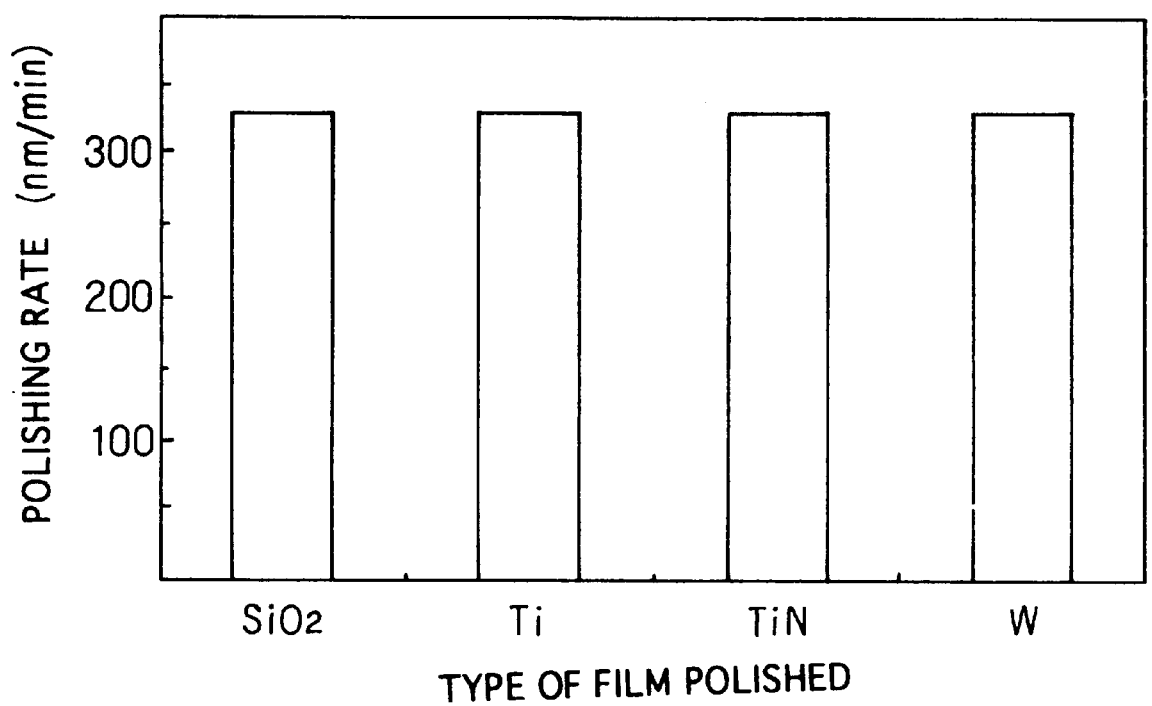
FIG. 7 is a graph illustrating an example of the relationship between the type of film polished and the polishing rate according to Embodiment 5 of the present invention.
Figure 8A:
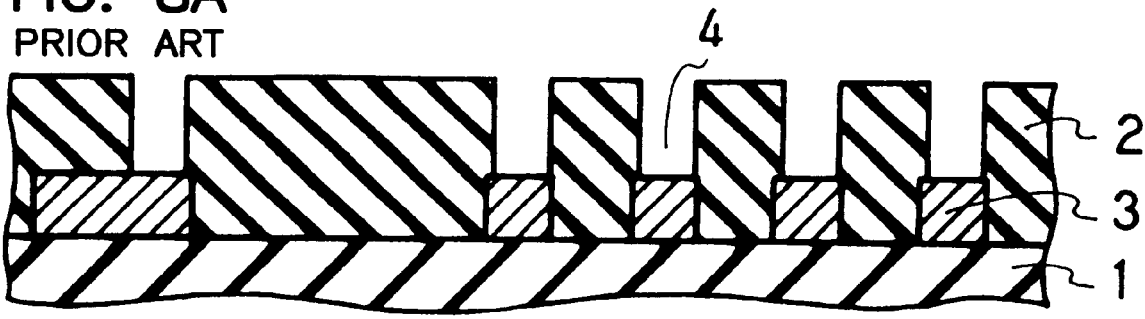
FIGS. 8A–8D show cross-sectional views of a semiconductor device being processed according to a conventional method for forming a metallic plug.
Figure 8B:
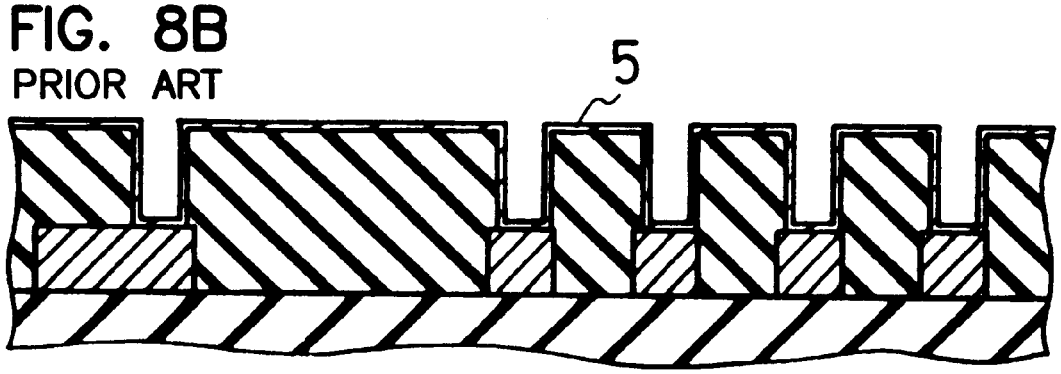
Figure 8C:
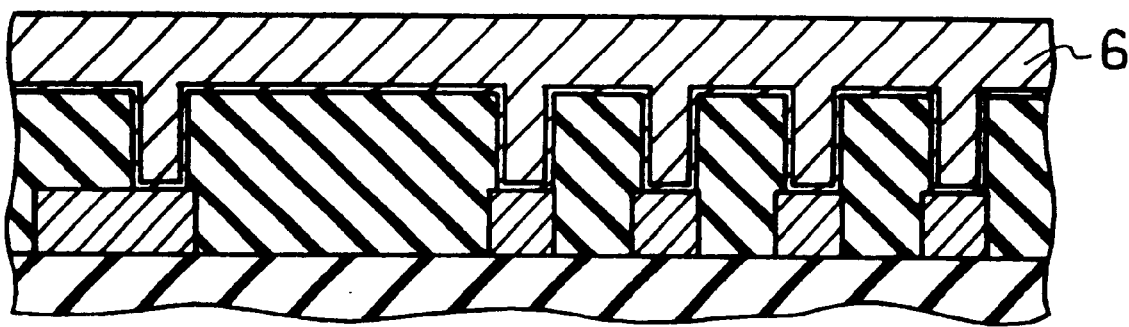
Figure 8D:
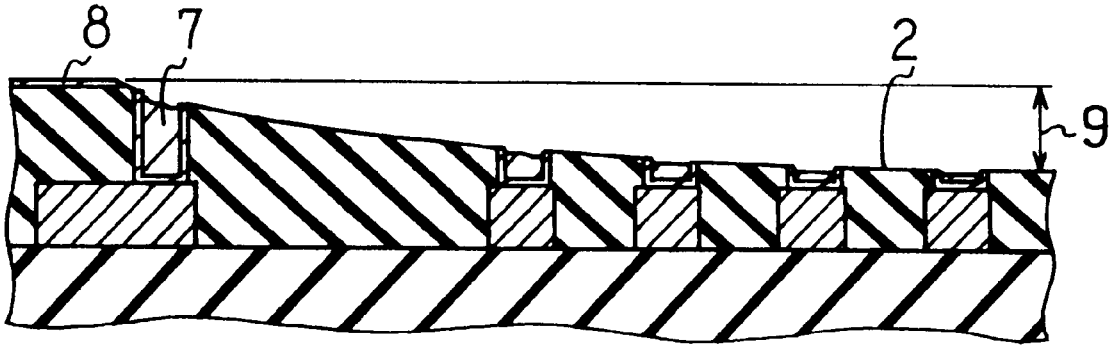

When a metallic plug is formed according to such a method mentioned above, erosion by overpolishing can be reduced, since there is no big difference between the polishing rate of the adhesive layer 5 having a layered structure of a titanium nitride film and a titanium film and that of the interlayer dielectric 2 that is a silicon oxide film as in an example shown in FIG. 7. As a result, the occurrence of defects due to a short between conductive layers caused by creating a portion where an adhesive layer can not be eliminated can be prevented. In addition, the decrease of reliability in a conductive layer caused by a change of plug resistance due to erosion can be prevented. Furthermore, the surface of a metallic plug 18 and that of the interlayer dielectric 2 forms an even surface as shown in FIG. 6E, since the polishing rate of the tungsten film 12 is also almost same as that of the adhesive layer 5 and that of the interlayer dielectric 2, thus preventing the decrease of reliability in a conductive layer.

In Embodiments 1–5 mentioned above, the explanation was made using a tungsten film as a filling film, but the same effect can be also obtained in the case of using another filling metal.

Moreover, the explanation was made using metal wiring composed of aluminum alloy as a conductive layer 3, but the same effect can be also obtained in the case of using a conductive layer or diffusion layer such as polycrystalline silicon or the like.

As mentioned above, according to a method for forming a metallic plug of the present invention, after eliminating a filling film by dry etching beforehand, the filling film and an adhesive layer are eliminated by polishing using a slurry for polishing a metal, thus preventing the occurrence of defects due to a short between conductive layers and the decrease of reliability in a conductive layer by a change of plug resistance.

Furthermore, after eliminating a filling film by dry etching beforehand until a part of an adhesive layer where an end connection is not formed is exposed, the adhesive layer exposed is eliminated by polishing using a slurry, thus preventing the occurrence of defects due to a short between conductive layers and the decrease of reliability in a conductive layer by a change of plug resistance.

Moreover, after eliminating a filling film and an adhesive layer by dry etching beforehand until a part of an interlayer dielectric where the end connection is not formed is exposed, the residue of the adhesive layer is eliminated by polishing using a slurry for polishing a metal, thus preventing the occurrence of defects due to a short between conductive layers and the decrease of reliability in a conductive layer by a change of plug resistance.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A method of forming a metallic plug for a semiconductor device, comprising:
   depositing an insulating layer on a substrate;
   forming a plurality of openings sparsely in some regions and densely in other regions in the insulating layer;
   depositing an adhesive layer on a surface of the insulating film including the plurality of openings;
   depositing a filling film on a surface of the adhesive layer including the plurality of openings so that height of the filling film is equal to or higher than the surface of the insulating film directly before the openings have been formed;
   dry etching the filling film so that a part of the filling film remains at portions where the openings have not been formed and the whole surface of the filling film is flattened; and
   eliminating the remaining filling film at the portions where the openings have not been formed and the adhesive layer under the filling film overall by polishing using a slurry for polishing a metal after the dry etching so that the filling film has substantially uniform thickness in the openings regardless of whether the plurality of openings are formed sparsely or densely.

2. A method for forming a metallic plug according to claim 1, wherein the adhesive layer has a layered structure of a titanium nitride film and a titanium film.

3. A method for forming a metallic plug according to claim 1, wherein the filling film is a tungsten film.

4. A method for forming a metallic plug according to claim 1, wherein the film thickness of the filling film before being dry etched is in the range of 0.3–1.0 $\mu$m at a portion not having an end connection.

5. A method for forming a metallic plug according to claim 1, wherein an amount of the filling film to be eliminated by dry etching is 60% or more of the film thickness of the filling film formed.

6. A method for forming a metallic plug for a semiconductor device, comprising:
   depositing an insulating layer on a substrate;
   forming a plurality of openings sparsely in some regions and densely in other regions in the insulating layer;
   depositing an adhesive layer on a surface of the insulating film including the plurality of openings;
   depositing a filling film on a surface of the adhesive layer including the plurality of openings so that height of the filling film is equal to or higher than the surface of the insulating film directly before the openings have been formed;
   dry etching the filling film until the adhesive layer at portions where the openings have not been formed is exposed so that the whole surface formed of the adhesive layer and the filling film in the openings is flattened; and
   eliminating the adhesive layer at the portions where the openings have not been formed overall by polishing using at least one slurry selected from a slurry for polishing a metal and a slurry for polishing an insulating film after the dry etching so that the filling film has substantially uniform thickness in the openings regardless of whether the plurality of openings are formed sparsely or densely.

7. A method for forming a metallic plug according to claim 6, wherein the adhesive layer has a layered structure of a titanium nitride film and a titanium film.

8. A method for forming a metallic plug according to claim 6, wherein the filling film is a tungsten film.

9. A method for forming a metallic plug according to claim 6, wherein the film thickness of the filling film before being dry etched is in the range of 0.3–1.0 $\mu$m at a portion not having an end connection.

10. A method for forming a metallic plug according to claim 6, wherein in eliminating the adhesive layer at the portions where the openings have not been formed overall by polishing, even after the adhesive layer at portions where the openings have not been formed is eliminated completely to expose the insulating film under the adhesive layer, the polishing is continued, and the polishing rates for the adhesive layer and the insulating film of at least one slurry selected from the slurry for polishing a metal and the slurry for polishing an insulating film are substantially the same.

11. A method for forming a metallic plug according to claim 10, wherein the polishing rate of the slurry for the filling film is lower than that for the adhesive layer and the insulating film.

12. A method for forming a metallic plug according to claim 6, wherein in eliminating the adhesive layer at the portions where the openings have not been formed overall by polishing, even after the adhesive layer at the portions where the openings have not been formed is eliminated completely to expose the insulating film under the adhesive layer, the polishing is continued, the insulating layer is an oxide film, and at least one slurry selected from the slurry for polishing a metal and the slurry for polishing an insulating film is a slurry for polishing an oxide film comprising at least one particle selected from the group consisting of a silicon oxide particle and a ceric oxide particle.

13. A method for forming a metallic plug according to claim 10, wherein polishing rates for the adhesive layer, the insulating film and the filling film of at least one slurry selected from the slurry for polishing a metal and the slurry for polishing an insulating film are substantially the same.

14. A method for forming a metallic plug according to claim 6, wherein the slurry is a slurry comprising mixed particles including two or more particles.

15. A method for forming a metallic plug according to claim 14, wherein the slurry is a slurry comprising mixed particles of a silicon oxide particle and an alumina particle.

16. A method for forming a metallic plug according to claim 14, wherein the slurry is a slurry comprising mixed particles of a ceric oxide particle and an alumina particle.

17. A method for forming a metallic plug, comprising:

depositing an insulating layer on a substrate;

forming a plurality of openings sparsely in some regions and densely in other regions in the insulating layer;

depositing an adhesive layer on a surface of the insulating film including the plurality of openings;

depositing a filling film on a surface of the adhesive layer including the plurality of openings so that the height of the filling film is equal to or higher than the surface of the insulating film directly before the openings have been formed;

dry etching the whole filling film at portions where the openings have not been formed and a part of the adhesive layer so as to flatten the whole surface of the adhesive layer and the filling film in the openings; and eliminating the remaining adhesive layer at the portions where the openings have not been formed overall by polishing using a slurry for polishing a metal after the dry etching so that the filling film has substantially uniform thickness in the openings regardless of whether the plurality of openings are formed sparsely or densely.

18. A method for forming a metallic plug according to claim 17, wherein the adhesive layer has a layered structure of a titanium nitride film and a titanium film.

19. A method for forming a metallic plug according to claim 17, wherein the filling film is a tungsten film.

20. A method for forming a metallic plug according to claim 17, wherein the film thickness of the filling film before being dry etched is in the range of 0.3–1.0 $\mu$m at a portion not having an end connection.

* * * * *